United States Patent [19]

Haze et al.

[11] Patent Number: 6,112,408
[45] Date of Patent: Sep. 5, 2000

[54] METHOD FOR FABRICATING A CHIP CARRIER WHICH INCLUDES AT LEAST ONE PHOTO-VIA

[75] Inventors: Takayuki Haze, Kyoto; Shigeaki Yamashita, Shiga-ken, both of Japan

[73] Assignee: International Business Machines Corporation, Armonk, N.Y.

[21] Appl. No.: 09/014,210

[22] Filed: Jan. 28, 1998

[30] Foreign Application Priority Data

Jan. 29, 1997 [JP] Japan ................................ 9-015259

[51] Int. Cl.⁷ ............................................. H01K 3/10
[52] U.S. Cl. .......................... 29/852; 430/156; 430/167; 430/280.1; 29/825
[58] Field of Search ........................... 29/825, 832, 830, 29/852, 831; 430/156, 167, 280.1

[56] References Cited

U.S. PATENT DOCUMENTS

| | | |
|---|---|---|
| 4,283,243 | 8/1981 | Andreades et al. . |
| 4,567,062 | 1/1986 | Fan . |
| 4,572,764 | 2/1986 | Fan . |
| 4,673,773 | 6/1987 | Nakano et al. . |
| 5,092,032 | 3/1992 | Murakami . |
| 5,137,618 | 8/1992 | Burnett et al. . |
| 5,200,026 | 4/1993 | Okabe . |
| 5,532,105 | 7/1996 | Yamadera et al. . |
| 5,576,148 | 11/1996 | Imai et al. . |
| 5,681,485 | 10/1997 | Yamagami et al. . |
| 5,784,781 | 7/1998 | Shirai et al. ............................. 427/97 |

FOREIGN PATENT DOCUMENTS

| | | |
|---|---|---|
| 08148566 | 7/1996 | Japan . |
| 08264957 | 11/1996 | Japan . |

OTHER PUBLICATIONS

"Encapsulated Dendrite Electrical Interconnect for Surface Mount Applications", vol. 38, No. 08, IBM Technical Disclosure Bulletin, Aug., 1995, pp. 267–268.

Primary Examiner—Carl J. Arbes
Attorney, Agent, or Firm—William N. Hogg

[57] ABSTRACT

A method for fabricating a chip carrier, e.g., a printed circuit board, which includes at least one photo-via is disclosed. This method inlcudes the steps of forming a first dielectric layer on a substrate. A second dielectric layer, having a greater photosensitivity than the first dielectric layer, is formed on the first dielectric layer. Preferably, this second dielectric layer has a relatively low optical absorptivity at the wavelengths to be used during exposure. Then, at least the second dielectric layer is selectively exposed to actinic radiation. The second and first dielectric layers are then developed, to form one or more desired photo-vias.

24 Claims, 3 Drawing Sheets

METHOD FOR FABRICATING A CHIP CARRIER WHICH INCLUDES AT LEAST ONE PHOTO-VIA

BACKGROUND OF THE INVENTION

1. Field of the Invention

The present invention relates generally to a method for fabricating a chip carrier, such as a printed circuit board, and more particularly to a method for fabricating a chip carrier which includes at least one photo-via.

2. Description of the Related Art

The density of electronic components mounted on chip carriers, such as printed circuit boards, is steadily increasing. This is a continuous process because such components are steadily being more compactly made, and because the number of leads, pins and/or solder ball arrays required on the corresponding chip carrier substrates is increasing in accordance with the reductions in the sizes of electronic apparatuses and improvements in their performances. Further, in response to demands for electronic apparatuses having higher speeds, it has become necessary to shorten circuit distances and thus reduce the time required for transferring electric signals. As a consequence of all this, the importance of chip carriers having a plurality of circuit layers, i.e., multilayer chip carriers, is constantly increasing.

To build a multilayer chip carrier, electrical connections must be formed between different circuit layers. For example, conventional multilayer chip carriers include through holes that penetrate the entire chip carrier substrate, the internal surfaces of which through holes are copper plated to provide electrical connections between different circuit layers. However, because through holes are formed using a mechanical method, such as one that involves the use of a mechanical drill, the substrate surface area consumed by the through holes is large, which is inconsistent with the need to increase electronic component density. If, for example, $10^4$ or more through holes are to be formed in a multi-layer chip carrier substrate, the manufacturing costs will be high and the process will not be practical.

An alternative to the use of copper plated through holes for electrically connecting circuit layers in multi-layer chip carriers is the use of photolithographically formed via holes, called photo-vias, for making such connections. (See, for example, Japanese Unexamined Patent Publication No. Hei 4-148590). Here, a photosensitive resin dielectric layer is formed on a first circuit layer, which has been formed on a substrate. This is achieved, for example, by depositing a liquid photosensitive resin dielectric material onto the first circuit layer using a curtain coater or a roll coater, and then drying the deposited material. Alternatively, a dry film of photosensitive resin dielectric material is pressure bonded to is the first circuit layer. Then, the photosensitive dielectric layer is photolithographically processed, i.e., exposed and developed, to form a predetermined pattern of photo-vias that penetrate only the dielectric layer. A second circuit layer is formed on the surface of the dielectric layer and the internal surfaces of the photo-vias are metallized. As a result, electrical connections are formed between the first and second circuit layers.

In this specification, a method for forming a chip carrier that includes at least two circuit layers and an intervening dielectric layer and that uses the above process is called a build-up method. A multilayer chip carrier, when fabricated by the assignee of the present application using the build-up method, is called a Surface Laminar Circuit (TM) (SLC) chip carrier. Significantly, in the case of an SLC chip carrier, the photo-vias used to make electrical connections between two circuit layers can be simultaneously and collectively formed by exposure and development, and the manufacturing costs remain stable, regardless of the number of photo-vias. Moreover, it is possible to form photo-vias having diameters which are much smaller than the diameters of via holes formed by drilling, and having a precise pattern. Consequently, the build-up method is regarded as the most effective method for implementing an increase in the component density of chip carriers.

Well known dielectric layers employed in the build-up method include denatured epoxy resin, which does not contain a photopolymerization initiator; a photosensitive dry film; a photosensitive resin coated on a non-photosensitive resin, such as a thin polyimide film; and a photosensitive resin employed by itself. Several recent unexamined Japanese patent publications feature the build-up method. For example, a multilayer chip carrier substrate employing a dielectric layer consisting of a photosensitive resin is disclosed in Japanese Unexamined Patent Publication No. Hei 8-18242. In this publication, a photosensitive resin consisting of an acrylic resin, a photopolymerized monomer, a photopolymerization initiator, a filler and a solvent is disclosed that can improve the features of the photosensitive resin, such as its heat resistance, chemical resistance, dielectric strength, permittivity and resolution. In addition, a method for forming a single dielectric layer by the lamination of two photosensitive dry film layers is disclosed in Japanese Unexamined Patent Publication No. Hei 8-152711. In this publication, in order to achieve high chemical resistance and high adhesion to copper plating, a first photosensitive dry film resin layer is provided which intimately contacts the copper plating layer. High chemical resistance and high dielectric strength are achieved by using a second photosensitive dry film resin layer that is formed under the first photosensitive dry film resin layer.

The present invention involves a problem associated with the use of what are initially liquid photosensitive dielectric layers, not dry film photosensitive layers. This problem is that of unwanted and unexpected extra via holes in the photosensitive dielectric layer, due to a phenomenon here termed "bubble eating", discussed below, and to the attachment of dust. It must be emphasized that "bubble eating" is a problem inherent to the formation of a chip carrier formed using a liquid resist coating, but does not occur when a chip carrier is formed using a photosensitive dry film, as in Japanese Unexamined Patent Publication No. Hei 8-152711.

In the build-up method, where a photosensitive dielectric layer is formed by applying a liquid resist coating, one generally employs a denatured epoxy resin that does not contain a photopolymerization initiator. The denatured epoxy resin has an epoxy group at either end of its molecular structure and a double bond in the center of its molecular structure. Consequently, when ultraviolet radiation is impinged upon the coated film, cross-linking only occurs in the upper portion of the coated film, and therefore only a relatively thin and weak photo-crosslinked layer is formed. In addition, the liquid resist coating is subject to "bubble eating," i.e., a foam is formed on the surface of the liquid resist consisting of tiny air bubbles produced during the coating procedure, and small holes are formed in the surface of the resist. Significantly, unwanted and unexpected extra via holes are formed in the dielectric layer due to "bubble eating", irregular coating and the attachment of dust particles during the liquid resist coating procedure. That is, when bubble eating occurs, light forms photo-crosslinks on the upper surface of the dielectric layer. However, because photo-crosslinks are not formed on the internal surfaces of the small holes produced by "bubble eating", a developing liquid can enter therein and cause voids. Also, because light can not reach the portions of the resist coating beneath the dust particles that become attached to the resist coating, these portions are not exposed and photo-crosslinks are not formed. For the above reasons, during the development procedure, unexpected voids occur at the "bubble eating" portions of the resist coating or at the dust attached portions, and thus, unwanted, extra via holes are formed.

Because the porosity of the photo-crosslinked layer formed with a low photosensitive dielectric layer is high, a developing liquid readily permeates the dielectric layer during the development process and produces unwanted, extra vias. Further, because the photo-crosslinked layer is not very hard, extra vias are caused by mechanical damage after the layer is exposed. Various other failures can also occur.

Conventionally, to overcome the problem of unwanted, extra vias, methods are employed for exposing the same pattern twice. This serves to reduce extra vias due to dust attachment and reinforces the photo-crosslinked layer by increasing the amount of light used for an exposure, thereby preventing the production of unwanted, extra vias caused by permeation with a developing liquid and by mechanical damage. However, using double exposures drastically deteriorates productivity. Furthermore, when increasing the amount of light used for exposure, "wrinkling" occurs on the surface of the dielectric layer due to a difference in the expansion/shrinkage rates for the photo-crosslinked layer (upper portion) and the non-photo-crosslinked layer (lower portion), and this prevents subsequent circuit formation.

To prevent such wrinkling, consideration has been given to the formation of a dielectric layer using a dry film method, which is disclosed in Japanese Unexamined Patent Publication No. Hei 8-152711 referred to above. With this dry film method, however, other problems arise, such as the irregular attachment of dry film when laminated, and the need for cleaning.

SUMMARY OF THE INVENTION

It is a first object of the present invention to prevent the occurrence of unwanted, extra vias.

It is a second object of the present invention to achieve the first object by preventing exposure failures due to bubble eating and dust attachment during the process of coating with a liquid resist.

It is a third object of the present invention to achieve the first object by forming a physically dense photo-crosslinked layer which is able to prevent erosion by a developing liquid and prevent mechanical damage.

It is a fourth object of the present invention to achieve the foregoing objects while also achieving a photosensitive dielectric having high dielectric strength, and good aging and heat resistance properties.

The above objects are achieved, according to the present invention, by a method for fabricating a chip carrier which comprises the steps of: forming a first photosensitive dielectric layer on a substrate; forming, on said first photosensitive dielectric layer, a second photosensitive dielectric layer having a greater photosensitivity than the first photosensitive dielectric layer; selectively exposing at least the second photosensitive dielectric layer to actinic radiation; and developing the first and second dielectric layers to form at least one via hole. The dielectric strength provided by the second dielectric layer is preferably less than that provided by the first dielectric layer.

BRIEF DESCRIPTION OF THE DRAWINGS

The invention is described with reference to the accompanying drawings, wherein.

DESCRIPTION OF THE PREFERRED EMBODIMENT

Figure 1:
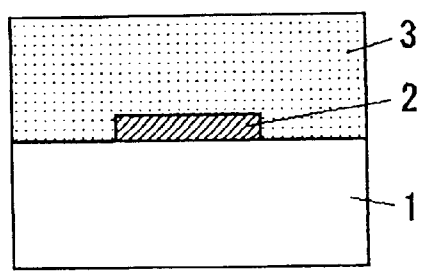
FIGS. 1–7 are cross-sectional views of a chip carrier undergoing fabrication, depicting the steps involved in a preferred embodiment of the inventive fabrication method.

A preferred embodiment of the present invention will now be described with reference to FIGS. 1 through 5. In accordance with this preferred embodiment, and as shown in FIG. 1, a circuit layer 2 is formed on a substrate 1, and a first dielectric layer 3 is then formed which covers the substrate 1 and the circuit layer 2. The first dielectric layer 3 is formed by using a method, such as the curtain coater process, that applies a liquid resist coating, and by preparatory drying of the resultant structure. The substrate 1 is generally a dielectric, and the circuit layer 2 is formed by patterning, e.g., selectively etching, copper foil. A photosensitive epoxy resin containing a filler is commonly employed for the first dielectric layer 3. The photosensitive epoxy resin may be a denatured epoxy resin, cationic polymerization epoxy resin, or radical polymerization epoxy resin. The first dielectric layer 3 is required to provide dielectric strength (an electroless plating feature), heat resistance, and durability rather than photosensitivity. Thus, in addition to epoxy resin, any other material that has such required features can be employed. One example resin that possesses the above features has an epoxy group at either end of its molecular structure and a double bond in the center of its molecular structure. Consequently, its photo-curing capability is relatively small, and photo-cross-links are only formed in the uppermost portion of the first dielectric layer.

It is preferable that the thickness of the first dielectric layer 3 range from about 20 $\mu$m to about 100 $\mu$m. The thickness depends greatly on the design of the product. Thicknesses less than about 20 $\mu$m are undesirable because they result in dielectric layers having undesirably low dielectric strength. Thicknesses greater than about 100 $\mu$m are undesirable because it is difficult to form such thick dielectric layers using conventional coating processes. The advantage of forming a dielectric layer by applying a liquid resist coating is that the thickness of the layer can be easily controlled to satisfy the requirements for a particular product application.

Figure 2:
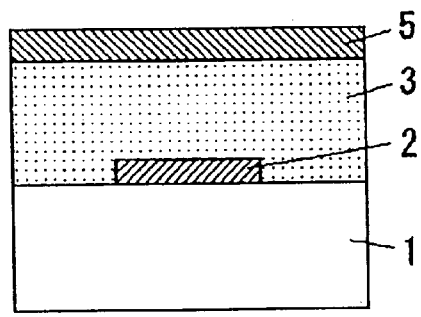

As is shown in FIG. 2, a second dielectric layer 5 is formed on the first dielectric layer 3. A liquid resist coating is uniformly applied using a method such as the curtain coater process, and preparatory drying of the resultant structure is performed to provide the second dielectric layer 5. A photopolymerization epoxy resin, polyester resin, urethane resin or polyhydric alcohol resin, which undergoes radical polymerization or cationic polymerization, or a rubber which is cured by photopolymerization, is appropriate for the second dielectric layer 5. It is important that the second dielectric layer 5 be adequately photosensitive. This photosensitivity is required in order to form a sufficiently strongly photopolymerized layer having a large volume using a relatively small amount of light. It is desirable that the second dielectric layer be capable of generating a photopolymerization chain reaction. When the second dielectric layer undergoes such a chain reaction, even if dust is attached to the exposed surface, an adequately photopolymerized layer is formed immediately under the dust by the surface refraction of light. As for the required photosensitivity for the second dielectric layer 5, a resolution that is adequate for forming a pattern of 200 μm lines, preferably 100 μm lines, according to IPC standard IPC-SM-840B, which is incorporated herein by reference and is the circuit pattern specification, is appropriate.

It is preferable that the second dielectric layer 5 undergoes photocuring, i.e., photopolymerization, substantially through its full thickness. Therefore, the optical absorptivity of the material of the second dielectric layer 5, at the wavelengths to be used in the exposure process, should be chosen in relation to the thickness of the second dielectric layer to achieve this objective. In general, this implies that the material of the second dielectric layer 5 will have a relatively low optical absorptivity at the wavelengths of interest. For the thicknesses specified below, the materials listed above and below have the requisite, relatively low optical absorptivity.

Since the second dielectric layer is to be substantially removed, as discussed below, the dielectric strength and the electroless plating properties of this layer are irrelevant.

An appropriate second dielectric layer 5 is a vinyl denatured epoxy resin. In particular, it is preferable that the epoxy resin have a vinyl group at one end of its molecular structure, contain acrylic oligomer and have a strong photo-curing capability, and that it undergoes a photopolymerization chain reaction that continues, due to the action of a photopolymerization initiator, until it reaches the lowermost portion of the layer. A photopolymerization layer formed with this resin is very dense and strong.

In order to form a sufficiently strong photopolymerized layer, the second dielectric layer need only be no more than about 20 μm thick. There is no advantage in forming a thicker second dielectric layer.

Figure 3:
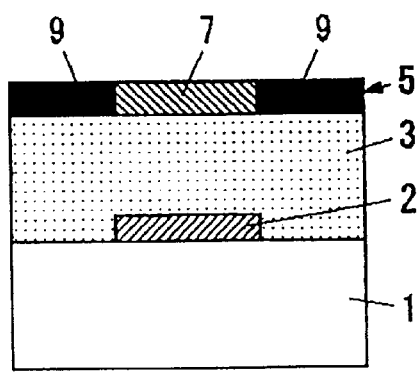

As shown in FIG. 3, at least the second dielectric layer 5 is now exposed to actinic radiation, e.g., UV light. For the exposure, a mask (not shown) is employed to form a predetermined pattern. As a result, the portion shielded from the light by the mask constitutes a non-exposed portion 7, and the portion that is not shielded from the light by the mask constitutes an exposed portion 9. The exposed portion 9, which is cured by light, is a photo-cured layer. The non-exposed portion 7 is generally positioned immediately around and above the circuit layer 2 that is the target for the electrical connection between the circuit layers.

Figure 4:
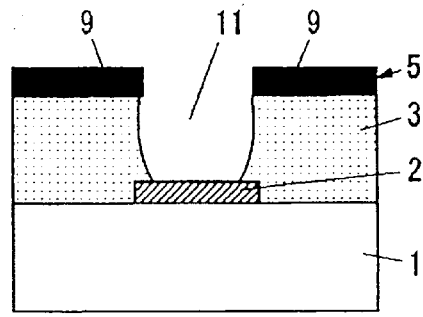

Then, as is shown in FIG. 4, the first dielectric layer 3 and the second dielectric layer 5 are developed at the same time. The non-exposed portion 7 of the second dielectric layer 5 and the first dielectric layer 3 immediately below are developed selectively. Then, well-known heat curing, surface grinding and chemical processes are performed to form a via hole 11 in the substrate 1. Since the via hole 11 is formed by erosion using the developing liquid, its wall faces are not vertical, but are curved.

Figure 5:
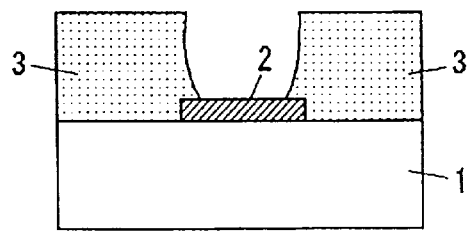

Finally, as is shown in FIG. 5, the photo-cured portion of the second dielectric layer 5 and part of the first dielectric layer 3 are removed by grinding. As a result, the second dielectric layer 5 is completely removed and the thickness of the first dielectric layer 3 is reduced almost to half of what it was when it was originally applied.

Figure 6:
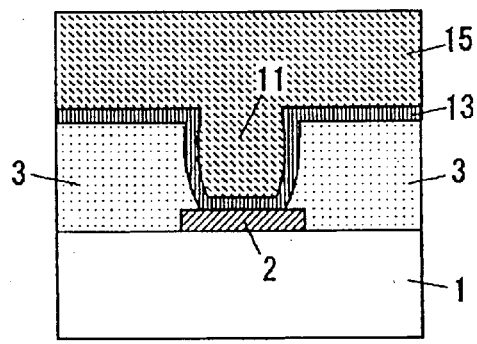

As is shown in FIG. 6, a second circuit layer 13 is formed on the first dielectric layer 3 and the internal surfaces of the via hole 11 are metallized, thereby connecting the circuit layer 13 to the previously formed circuit layer 2. A new dielectric layer 15 is formed on the first dielectric layer 3, the first circuit layer 2 and second circuit layer 13, to provide a multilayer structure. A via hole is formed in the dielectric layer 15 using the same procedures as described above, and thus another connection between layers is effected.

Figure 7:
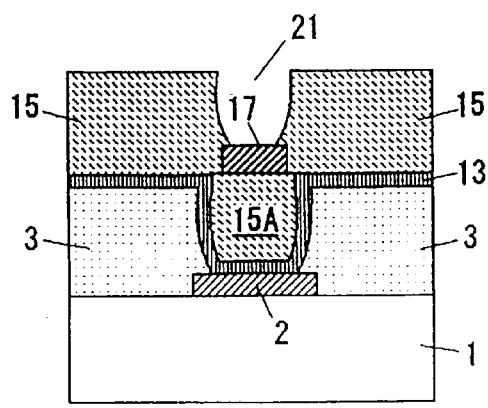

The cross section of a "laminated via" formed by the method of the present invention is shown in FIG. 7. The laminated via is a structure wherein a via hole 21 is formed immediately above another via hole 11, as is shown in FIG. 7. Because the laminated via may be positioned wherever it is so desired, design freedom is enhanced, and as via hole density is increased, the circuit layer density can also be increased.

According to the present invention, because the dielectric layer is formed by applying a liquid resist coating, a laminated via can be formed. This is significant because, in order to form the laminated via, it is necessary for the internal portion of the via hole to be filled with resin layers 15 and 15A, and for another wiring layer 17 to be formed immediately above. With the dry film method described in Japanese Unexamined Patent Publication No. Hei 8-152711, for example, since dry film is not flexible enough to fill the internal portion 15A of the via hole, filling the internal portion 15A of the via hole is difficult, and thus a laminated via can not be formed.

EXAMPLES

An SLC chip carrier was fabricated using the preferred embodiment of the present invention. A denatured epoxy resin was employed for the first dielectric layer, and was applied by a curtain coater at a density of about 0.023 g/cm². This first dielectric layer had a thickness of 60 μm. Preparatory curing of the first dielectric layer was performed and the second dielectric layer was applied by the curtain coater. The second dielectric layer had a thickness of 30 μm. The resultant structure was heated to about 90° C. and dried. Following this, a light source having a peak intensity at 420 nm was used to expose the structure, which was then developed. As a result, neither unwanted extra vias nor wrinkling occurred.

The exposure was performed by setting the exposure intensity between 360 mj to 560 mj. As a result, unwanted extra vias occurred at 360 mj, while almost no unwanted extra vias occurred at 420 mj or higher. The size of the via obtained by grinding did not greatly change depending on the exposure intensity, and was approximately 160 μm at the surface of the dielectric layer and 120 μm at the surface of the substrate.

As noted above, when the conventional fabrication method is used, wherein a single dielectric layer is formed and then exposed and developed, the occurrence of unwanted extra vias and of wrinkling is observed. By contrast, when the present invention is employed, unwanted extra vias and wrinkling are avoided and the yield for SLC chip carriers is drastically improved.

Figure 8:
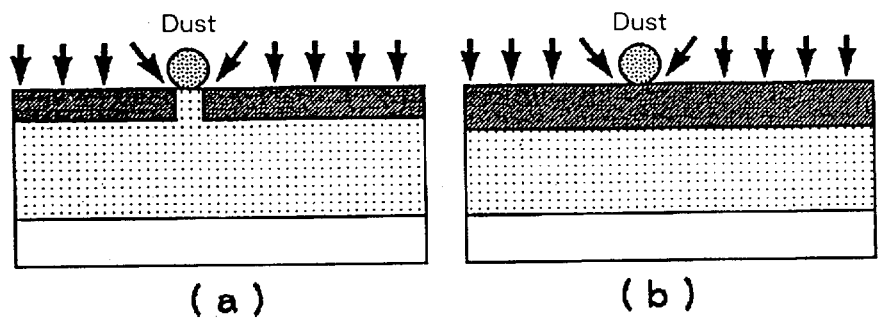
FIGS. 8(a) and 8(b) are cross-sectional views which depict how the present invention avoids unwanted extra vias due to dust.

A significant advantage of the present invention is that even when dust is attached to the surface of a dielectric layer, the portion immediately under the dust can be adequately exposed during the exposure procedure, and failures, i.e., unwanted, extra vias, are substantially reduced. More specifically, as is shown in FIG. 8(a), when a low photosensitive dielectric layer is employed, an exposed layer (indicated as a dark portion) is not formed immediately under the dust, and thus this produces a void (extra via) in the following developing procedure. However, as is shown in FIG. 8(b), because with the present invention a superior photosensitive dielectric layer is employed on the surface to be exposed, a photopolymerization chain reaction occurs even at the portion immediately under the dust, and very few, if any, adverse effects are produced by the developing procedure.

Figure 9:
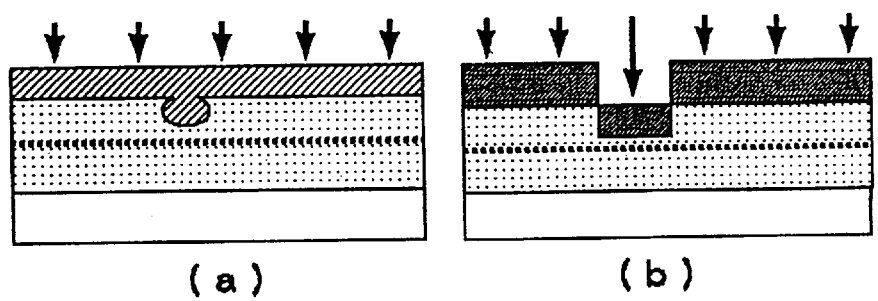
FIGS. 9(a) and 9(b) are cross-sectional views which depict how the present invention avoids unwanted extra vias due to bubble eating and irregular coating.

Further, even when bubble eating occurs during the coating of either the first or the second dielectric layer, very few, if any, failures are caused. If bubble eating occurs while applying the second dielectric layer to the first dielectric layer, as is shown in FIG. 9(a), because the second dielectric layer formed thereon possesses a relatively high photosensitivity and a relatively low optical absorptivity, no void occurs. In addition, because the portion of the first dielectric layer in which bubble eating occurs is included in the portion (above the broken line) that is finally removed, there is no adverse effect on the final product. In the present invention, if bubble eating occurs while the second dielectric layer is being applied, as is shown in FIG. 9(b), the first dielectric layer, which possesses a weak photo-curing property, forms a photo-cross-link and prevents this portion from being developed, so that no void is produced. As is shown in FIG. 9(b), although the surface of the second dielectric layer is raised and recessed, this raised and recessed portion is also normally included in the portion (above the broken line) that is removed by the following grinding procedure, and there is no adverse affect on the final product.

As is described above, according to the present invention, the occurrence of unwanted, extra vias is prevented. More specifically, according to the present invention, it is possible to prevent an exposure failure due to bubble eating and dust attachment during the coating with a liquid resist. Further, because a layer having a strong photo-curing property and relatively low optical absorptivity is formed in this invention, it is possible to prevent the erosion caused by a developing liquid and to prevent surface roughness due to mechanical reasons. In addition to the above effects, according to the present invention, dielectric strength, aging and heat resistance, which are original features of the dielectric layer, are maintained.

We claim:

1. A method for fabricating a chip carrier, comprising the steps of forming a first dielectric layer on a substrate;
    forming, on said first dielectric layer, a second dielectric layer having a greater photosensitivity than said first dielectric layer;
    selectively exposing at least said second dielectric layer to actinic radiation;
    developing said first and second dielectric layers to form at least one via hole;
    removing said second dielectric layer in its entirety to reveal a surface on said first dielectric layer; and
    curing said first dielectric layer throughout its thickness.

2. The method of claim 1, wherein the second dielectric layer is chosen to have an optical absorptivity, in relation to the thickness of the second dielectric layer, so that the selectively exposed portions of said second dielectric layer are exposed substantially through the full thickness of said second dielectric layer.

3. The method of claim 1 wherein said substrate includes a first circuit layer.

4. The method of claim 3, further comprising the step of forming a second circuit layer on said first dielectric layer.

5. The method of claims 4, further comprising the step of metallizing an internal surface of said via hole, thereby forming an electrical connection between said first and second circuit layers.

6. The method of claim 1, wherein said first dielectric layer includes a denatured epoxy resin.

7. The method of claim 1, wherein said first dielectric layer includes a cationic polymerization epoxy resin.

8. The method of claim 1, wherein said first dielectric layer includes a radical polymerization epoxy resin.

9. The method of claim 1, wherein said first dielectric layer has a thickness ranging from about 20 $\mu$m to about 100 $\mu$m.

10. The method of claim 1, wherein said second dielectric layer includes a photopolymerization epoxy resin.

11. The method of claim 1, wherein said second dielectric layer includes a polyester resin.

12. The method of claim 1, wherein said second dielectric layer includes a urethane resin.

13. The method of claim 1, wherein said second dielectric layer includes a polyhydric alcohol resin.

14. The method of claim 1, wherein said second dielectric layer includes a photopolymerizable rubber.

15. The method of claim 1, wherein said second dielectric layer includes a vinyl denatured epoxy resin.

16. The method of claim 1, wherein said second dielectric layer has a thickness of no more than about 20 $\mu$m.

17. The method of claim 1, wherein said step of forming said first dielectric layer includes the step of depositing the material of said first dielectric layer in liquid form.

18. The method of claim 1, wherein said step of forming said second dielectric layer includes the step of depositing the material of said second dielectric layer in liquid form.

19. The method of claim 5, further comprising the steps of:
    forming said second circuit layer on said first surface of said first dielectric layer;
    forming a third dielectric layer, being deposited in liquid form;
    forming on said third dielectric layer a fourth dielectric layer having a greater photosensitivity than said third dielectric layer;
    selectively exposing at least said fourth dielectric layer to actinic radiation;
    developing said third and fourth dielectric layers to form at least one via hole;
    removing said fourth dielectric layer in its entirety to reveal a surface on said third dielectric layer; and
    curing said dielectric layer throughout its thickness.

20. The method of claim 19, wherein said at least one vial hole in the third dielectric layer is vertically aligned with the via hole in the first dielectric layer.

21. The method of claim 19, further comprising the step of forming a third circuit layer on said third dielectric layer.

22. The method of claim 21, further comprising the step of metallizing an internal surface of said via hole in said third dielectric layer.

23. The method of claim 19, wherein said third dielectric layer has a thickness ranging from about 20 microns to about 100 microns.

24. The method of claim 19, wherein said fourth dielectric layer has a thickness of no more than about 20 microns.

* * * * *